United States Patent
Bunea

(10) Patent No.: US 11,502,640 B2
(45) Date of Patent: Nov. 15, 2022

(54) PHOTOVOLTAIC PANEL HAVING AN ADHERED SUPPORT FRAME

(71) Applicant: SUNPOWER CORPORATION, San Jose, CA (US)

(72) Inventor: Gabriela Elena Bunea, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 363 days.

(21) Appl. No.: 15/197,576

(22) Filed: Jun. 29, 2016

(65) Prior Publication Data

US 2018/0006598 A1   Jan. 4, 2018

(51) Int. Cl.
| | |
|---|---|
| H02S 30/10 | (2014.01) |
| H01L 31/048 | (2014.01) |
| H01L 31/049 | (2014.01) |
| H01L 31/18 | (2006.01) |

(52) U.S. Cl.
CPC ............ *H02S 30/10* (2014.12); *H01L 31/049* (2014.12); *H01L 31/0481* (2013.01); *H01L 31/1876* (2013.01); *Y02E 10/50* (2013.01)

(58) Field of Classification Search
CPC ............... H02S 20/00–32; H02S 30/10; H01L 31/48–49; Y02E 10/50
See application file for complete search history.

(56) References Cited

U.S. PATENT DOCUMENTS

| | | | | |
|---|---|---|---|---|
| 4,535,961 A | * | 8/1985 | Sobczak | F24J 2/542 248/183.2 |
| 4,611,090 A | * | 9/1986 | Catella | H01L 31/048 136/251 |
| 5,733,382 A | * | 3/1998 | Hanoka | B32B 17/10036 136/251 |
| 2008/0172955 A1 | * | 7/2008 | McClintock | H02S 20/23 52/173.3 |
| 2010/0132761 A1 | * | 6/2010 | Echizenya | H01L 31/048 136/244 |
| 2010/0132766 A1 | * | 6/2010 | Jenkins | F24J 2/5211 136/251 |
| 2011/0000543 A1 | * | 1/2011 | Errico | F24S 23/77 136/259 |
| 2013/0061909 A1 | * | 3/2013 | Jacquot | F24J 2/5205 136/246 |
| 2013/0061912 A1 | * | 3/2013 | Beck | H02S 20/23 136/251 |

(Continued)

FOREIGN PATENT DOCUMENTS

WO   WO-2009127342 A2 * 10/2009 ............. H02S 20/10

OTHER PUBLICATIONS

Machine translation of WO-2009127342-A2.*

*Primary Examiner* — Golam Mowla
(74) *Attorney, Agent, or Firm* — Grasso PLLC

(57) ABSTRACT

A photovoltaic panel having a distributed support frame adhered to a photovoltaic module is described. For example, the distributed support frame may include one or more support member or support mounts adhered to the photovoltaic module by an adhesive layer. The photovoltaic module may include layers bound together by an encapsulant. Accordingly, the distributed support frame may be attached to the photovoltaic module during a same lamination process used to laminate the photovoltaic module.

18 Claims, 4 Drawing Sheets

(56) References Cited

U.S. PATENT DOCUMENTS

2013/0243939 A1\* 9/2013 Hahn .................. H01L 31/18
427/74
2017/0133529 A1\* 5/2017 Thiel .................. H01L 31/048

\* cited by examiner

PHOTOVOLTAIC PANEL HAVING AN ADHERED SUPPORT FRAME

BACKGROUND

Photovoltaic (PV) cells, commonly known as solar cells, are well known devices for converting solar radiation into electrical energy. Generally, solar cells are fabricated on a semiconductor wafer or substrate using semiconductor processing techniques to form a p-n junction near a surface of the substrate. Solar radiation impinging on the surface of the substrate creates electron and hole pairs in the bulk of the substrate, which migrate to p-doped and n-doped regions in the substrate, thereby generating a voltage differential between the doped regions. The doped regions are coupled to metal contacts on the solar cell to direct an electrical current from the cell to an external circuit coupled thereto. Generally, an array of solar cells, each solar cell interconnected, is mounted on a common or shared platform to provide a photovoltaic module. A photovoltaic module may be composed of a photovoltaic laminate. A plurality of photovoltaic modules or module groups may be electrically coupled to an electrical power distribution network, forming a photovoltaic system.

DETAILED DESCRIPTION

Figure 1:
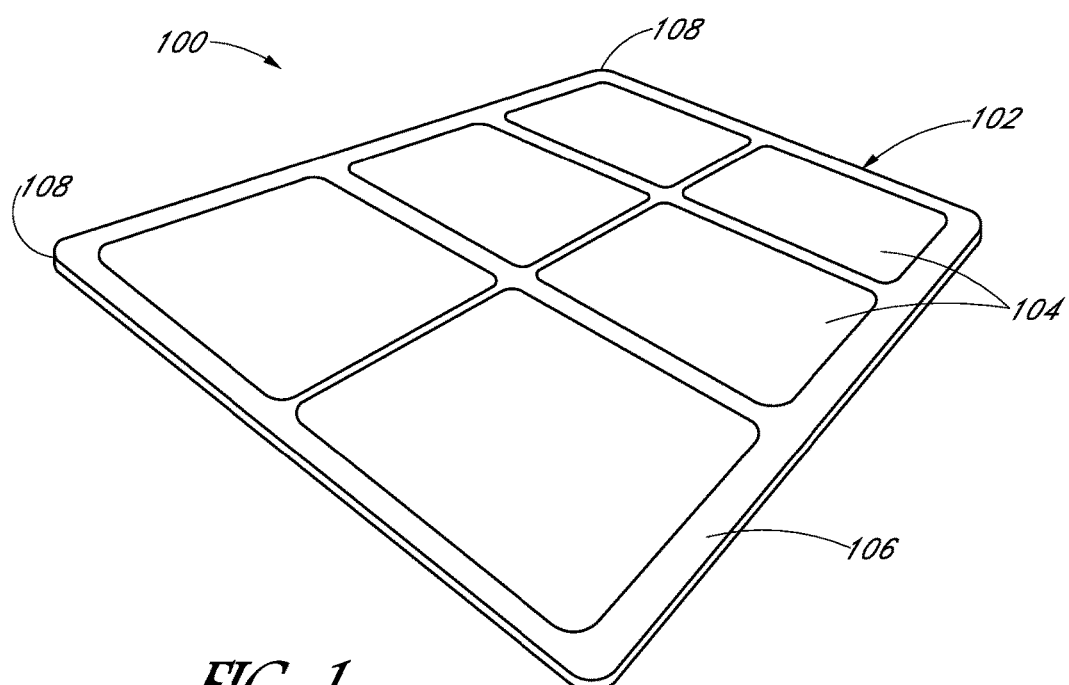
FIG. 1 illustrates a perspective front view of a photovoltaic panel, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology.

The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" direction does not necessarily imply that this direction is the first direction in a sequence; instead the term "first" is used to differentiate this direction from another direction (e.g., a "second" direction).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper," "lower," "above," "below," "in front of," and "behind" refer to directions in the drawings to which reference is made. Terms such as "front," "back," "rear," "side," "outboard," "inboard," "leftward," and "rightward" describe the orientation and/or location of portions of a component, or describe the relative orientation and/or location between components, within a consistent but arbitrary frame of reference which is made clear by reference to the text and the associated drawings describing the component(s) under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

PV cells can be assembled into PV modules, which may be used to convert sunlight into electricity. PV modules may include a PV cell encapsulated between a front sheet and a back sheet during a lamination process. After the PV module is formed by the lamination process, a support frame is typically attached to the PV module to form a PV panel. The support frame may include aluminum frame members that are bonded to an outer edge of the PV module by an adhesive, e.g., a silicone-based adhesive.

Existing photovoltaic (PV) panels include adhesive bonds between a PV module and a support frame around an outer edge of the PV module. The adhesive bonds typically include silicone-based adhesive (RTV), and are formed as part of a secondary process distinct from and after a lamination process used to form the PV module. Convention RTV bonds require lengthy curing times to reach a mechanical strength at which the PV panel may be safely handled. A two-part RTV may be used to expedite the curing, but may also be more expensive and require more complex tools than a conventional RTV, effectively doubling a required capital expenditure investment for the process. Thus, providing a PV panel having a distributed support frame adhered to a PV module during a lamination process without RTV can reduce a time and cost to manufacture a PV panel.

In an aspect, a PV panel having a PV module adhered to a distributed support frame is provided. More particularly, one or more support members or mounts of the distributed support frame may be adhered to the PV module inward from an outer edge of the PV module. Support ribs may be mechanically connected to the support members or mounts to support the PV module laterally. The support members or mounts may be adhered to the PV module during a lamination process, i.e., concurrently with the encapsulation of a PV cell in the PV module. Thus, material costs associated with secondary RTV bonding operations may be eliminated, and the overall manufacturing time may be compressed by performing the encapsulation and frame bonding operations in parallel with each other. Furthermore, the distributed support frame may include plastic components having a smaller profile as compared to conventional aluminum edge-supporting frames, and thus, the PV panel may have less weight and be less costly to ship to a customer or installation site.

The aspects described above may be realized by the PV panel having a PV module adhered to a distributed support frame during a lamination process as disclosed herein. In the following description, numerous specific details are set forth, such as specific material regimes and component structures, in order to provide a thorough understanding of embodiments of the present disclosure. It will be apparent to one skilled in the art that embodiments of the present disclosure may be practiced without these specific details. In other instances, well-known fabrication techniques or component structures, such as specific types of adhesives or techniques for laminating PV module components, are not described in detail in order to not unnecessarily obscure embodiments of the present disclosure. Furthermore, it is to be understood that the various embodiments shown in the figures are illustrative representations and are not necessarily drawn to scale.

By way of summary, disclosed herein is a PV panel having a distributed support frame adhered to a PV module during a lamination process. In an embodiment, a PV panel includes an adhesive layer between a back surface of a PV module and an interfacial surface of one or more support members or mounts, e.g., a support hub, a support rail, or a corner support, of a distributed support frame. The PV module may include a PV cell encapsulated by an encapsulant between a front layer and a back layer. Furthermore, the interfacial surface may be inward from a lateral perimeter of the back surface. The distributed support frame may include a support rib extending laterally across the back surface, e.g., between the support hub and the corner support. Thus, the distributed support frame may be permanently adhered to the PV module by the adhesive layer to support the PV module against external loading such as wind or snow loading.

Also by way of summary, disclosed herein is a method of adhering a PV module to a distributed support frame during a lamination process. In an embodiment, the method includes sandwiching a PV cell between an encapsulant to encapsulate the PV cell between a front layer and a back layer of a PV module. An adhesive may be applied between a back surface of the PV module and an interfacial surface of a support member or mount, e.g., a support hub and/or a corner support, of a distributed support frame. The adhesive may be applied before curing the encapsulant. Thus, the adhesive and the encapsulant may be cured simultaneously, i.e., during a same lamination operation, to attach the support hub and/or corner support to the back surface of the PV module at a same time as the laminate structure of the PV module is bound together. Other components of the distributed support frame, e.g., a support rib, may be mechanically connected between the support hub and the corner support after the lamination operation to form a PV panel.

Referring to FIG. 1, a perspective front view of a PV panel is illustrated in accordance with an embodiment of the present disclosure. A PV panel 100 may include a PV module 102 having one or more PV cells 104. For example, PV cells 104 may be arranged in a grid, i.e., several row(s) or column(s), inward from an outer edge of PV panel 100.

Figure 2:
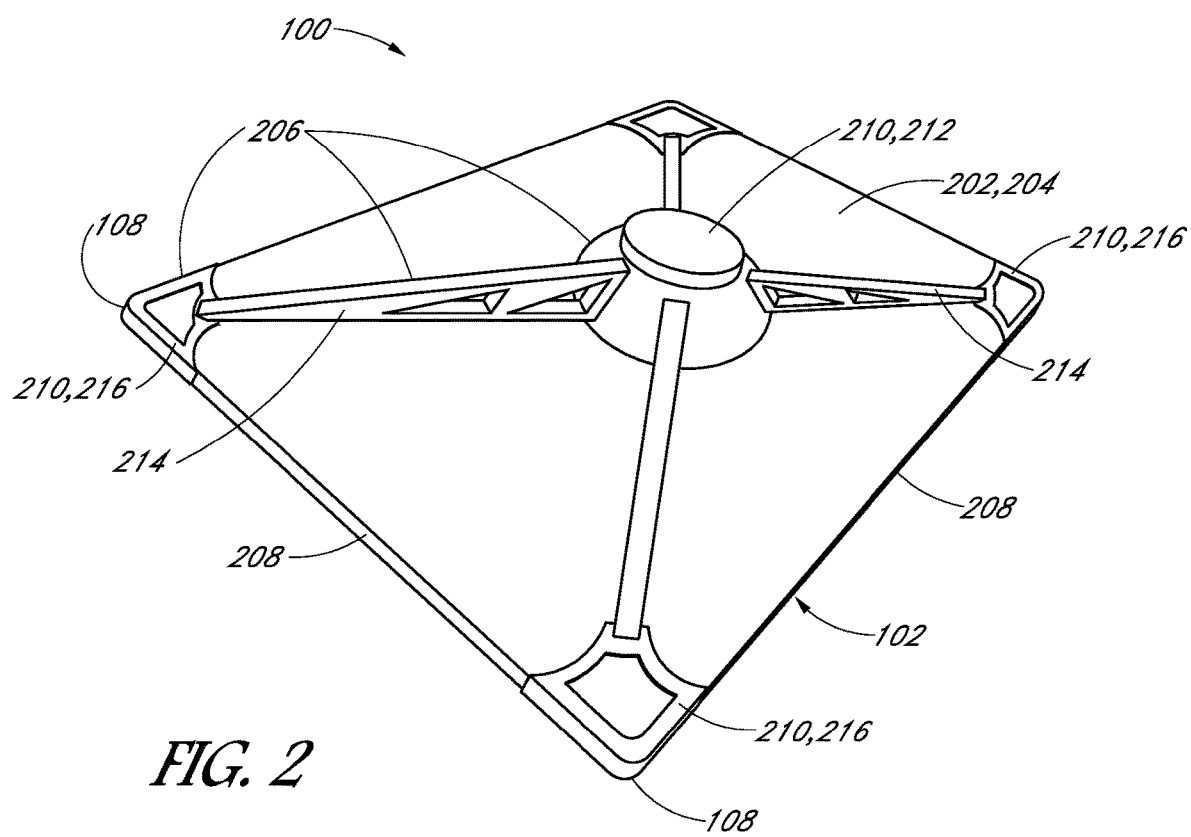
FIG. 2 illustrates a perspective back view of a photovoltaic panel, in accordance with an embodiment of the present disclosure.

PV module 102 may include a laminated structure. For example, PV cell 104 may be under a front layer 106, e.g., a front sheet of transparent material, and above a back layer (FIG. 2). PV cell 104 may include a cell surface facing upward to receive sunlight. By way of example, front layer 106 may include a glass sheet extending laterally between several corners 108 of PV module 102 over PV cell 104. The sunlight may transmit through front layer 106 to PV cell 104.

The illustrated example of PV module 102 is rectangular, and thus, PV panel 100 may include four corners 108. A shape of PV panel 100, however, may vary and may include no corners, e.g., when PV panel 100 is circular, or more than four corners, e.g., when PV panel 100 is octagonal.

Referring to FIG. 2, a perspective back view of a PV panel is illustrated in accordance with an embodiment of the present disclosure. PV module 102 may include a back layer 202 on an opposite side of the laminate structure from front layer 106. That is, PV cell 104 may be sandwiched between front layer 106 and back layer 202 within the laminate structure of PV module 102. In an embodiment, back layer 202 includes a polymer sheet. For example, back layer 202 may be an opaque, transparent, or translucent plastic sheet having a back surface 204 facing downward or away from the sunlight.

Back surface 204 may have a lateral perimeter 208 extending around back layer 202. For example, lateral perimeter 208 may vertically aligned with the outer edge of front layer 106. Thus, PV cells 104 may be considered to be inward from lateral perimeter 208 above back layer 202.

PV panel 100 may include a distributed support frame 206 attached to PV module 102. More particularly, distributed support frame 206 may include one or more support members or mounts 210 mounted on back surface 204 of PV module 102. More particularly, in an embodiment, several support mounts 210 are attached to back layer 202 on back surface 204 and/or to an outward facing edge of back layer 202 along lateral perimeter 208. The attachment between support mounts 210 and back layer 202 may be formed during a lamination process, as described below. Accordingly, support mounts 210 may be permanently adhered to back layer 202.

In an embodiment, at least one support member or mount 210 is attached to back surface 204 laterally inward from lateral perimeter 208. For example, a support hub 212 of distributed support frame 206 may be mounted on back surface 204 of PV module 102 inward from lateral perimeter 208. In an embodiment, support hub 212 is mounted along a central axis extending through PV module 102 perpendicular to back surface 204. Accordingly, support hub 212 may provide a central support for PV module 102 and for other members of distributed support frame 206. More particularly, support hub 212 may be mounted on an external support structure, e.g., a roof, and the external support structure may hold and support hub 212, which provides stability to distributed support frame 206 and PV module 102 connected to distributed support frame 206.

Although support hub 212 is provided throughout this description as a primary embodiment of a support member or mount attached to back surface 204, it will be appreciated that other support members may be mounted on back surface 204 within the scope of this description. For example, the support members may include a support rail (not shown), which may be adhered to back surface 204 in a same manner as support hub 212 is described being attached. The support rail may be an elongated low profile rail, such as a T-slotted aluminum extrusion rail. In an embodiment, several support rails may be mounted on back surface 204 and interconnected. For example, the support rails may extend in a different directions orthogonal to each other in a crossing pattern. In an embodiment, several rails extend along a horizontal plane and several rails extend in a second direction orthogonal to the first direction along the horizontal plane. The first set of rails extending in the first direction may be termed x-axis rails and the second set of rails extending in the second direction may be termed y-axis rails. Accordingly, distributed support frame 206 may include a supportive structure having a network of crossed and interconnected x-axis rails and y-axis rails. The crossing rails may be interconnected by mechanical fasteners, thermal welding, or other attachment mechanisms. Furthermore, the elongated support members of distributed support frame 206 may be adhered to back surface 204.

Other support members of distributed support frame 206 may include one or more support rib 214. For example, distributed support frame 206 may include several support ribs 214 radiating from support hub 212. That is, each support rib 214 may extend laterally from support hub 212 over back surface 204. As described below, each support rib 214 may be mechanically coupled to support hub 212. Accordingly, support ribs 214 may provide a distributed lateral support across back surface 204 of PV module 102 about the vertical axis passing through support hub 212.

Support members or mounts 210 of distributed support frame 206 may include one or more corner supports 216. For example, a corner support 216 may be located at each corner 108 of PV module 102. More particularly, each corner support 216 may be mounted on back surface 204 of back layer 202 at a respective corner 108. Corner supports 216 may be adhered to back layer 202 along the outward facing edge at lateral perimeter 208 and/or on back surface 204 inward from lateral perimeter 208. Corner supports 216 may provide a stable support relative to PV module 102, similar to the support provided by support hub 212. In an embodiment, support ribs 214 extends between support hub 212 and corner supports 216. Accordingly, support ribs 214 may provide a distributed lateral support across back surface 204 of PV module 102 between the vertical axis passing through support hub 212 and corners 108 or lateral perimeter 208 of PV module 102.

Figure 3:
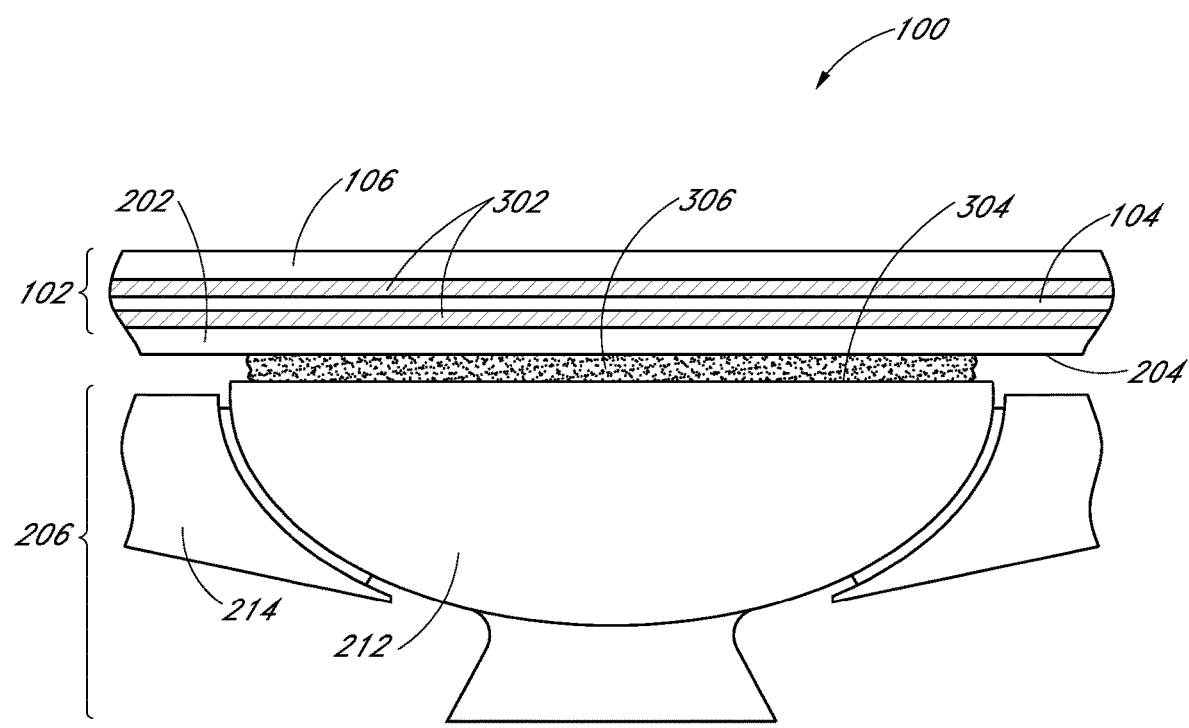
FIG. 3 illustrates a cross-sectional view of a photovoltaic module adhered to a distributed support frame, in accordance with an embodiment of the present disclosure.

Referring to FIG. 3, a cross-sectional view of a PV module adhered to a distributed support frame is illustrated in accordance with an embodiment of the present disclosure. The laminate structure of PV module 102 includes an encapsulant 302 between front layer 106 and PV cell 104. Similarly, PV module 102 may include encapsulant 302 between back layer 202 and PV cell 104. As described below, encapsulant 302 may be applied and cured between front layer 106 and back layer 202 to encapsulate PV cell 104 and provide an adhesion interface between the layers of PV module 102. Such adhesion interfaces can facilitate long-term reliability of PV panel 100, by resisting delamination, and can facilitate PV panel efficiency, by minimizing refraction losses of sunlight transmitted through the laminate structure. Accordingly, encapsulant 302 may include a material with excellent adhesion and light transmission characteristics, such as a thermoplastic olefin, e.g., polyethylene.

The laminate structure of PV panel 100, i.e., PV module 102, may be adhered to distributed support frame 206. For example, a support member or mount of distributed support frame 206, e.g., support hub 212, may have an interfacial surface 304 facing back surface 204 of back layer 202, and an adhesive layer 306 may be disposed between back surface 204 and interfacial surface 304. More particularly, adhesive layer 306 may be an adhesive bond between PV module 102 and distributed support frame 206. Furthermore, the adhesive bond may be inward from lateral perimeter 208, such that support hub 212 provide support to support ribs 214 at a centrally located portion of back layer 202.

The support provided by distributed support frame 206 may have particular utility in the context of PV module 102 having front layer 106 and back layer 202 formed from different materials. In an embodiment, front layer 106 and back layer 202 may have different elastic moduli, e.g., front layer 106 may include glass and back layer 202 may include polymer. Thus, the layers may deflect differently under external loading, e.g., wind or snow loading. Furthermore, when back layer 202 is a plastic sheet, PV module 102 may flex excessively under such external loading. Accordingly, PV module 102 may benefit from the additional support provided by laterally extending support ribs 214 of distributed support frame 206 when PV module 102 has an asymmetric laminate structure. Distributed support frame 206 adhered to PV module 102 may also provide manufacturability and cost advantages, even when PV module 102 is symmetric, e.g., when front layer 106 and back layer 202 are formed from a same material such as glass.

Although front layer 106 and back layer 202 may include different elastic moduli, the layers may alternatively include a same elastic modulus. For example, front layer 106 and back layer 202 may be formed of a same material, e.g., glass-glass or polymer-polymer. In the case of PV module 102 having a polymeric front layer 106 and a polymeric back layer 202, PV module 102 may be a flexible panel. PV module 102 may nonetheless be adequately supported by distributed support frame 206 to provide a lightweight and robust PV panel 100.

In an embodiment, adhesive layer 306 includes an adhesive material similar to, or the same as, encapsulant 302. That is, adhesive layer 306 may include a heat cured adhesive such that adhesive layer 306 can be cured during a same lamination operation as encapsulant 302. For example, adhesive layer 306 may include a high temperature melt or thermoset adhesive, such as a thermoplastic olefin. Accordingly, the layers of the laminate structure of PV module 102 may be attached to each other at the same time that a support mount 210 of distributed support frame 206 is attached to PV module 102.

Adhesive layer 306 may include a light cured material. For example, adhesive layer 306 may cure when irradiated by ultraviolet light, i.e., the adhesive may be a UV cure adhesive. Furthermore, in an embodiment, the support member or mount 210 adhered to back surface 204, e.g., support hub 212, may be formed from a translucent material. That is, support hub 212 may be translucent to ultraviolet light such that ultraviolet light may be transmitted through support hub 212 toward back surface 204 to cure adhesive layer 306 and bond support hub 212 to PV module 102. Accordingly, adhesive layer 306 may be cured simultaneously with encapsulant 302, albeit by a different curing mechanism than the thermal cure used to cross-link encapsulant 302.

Figure 4:
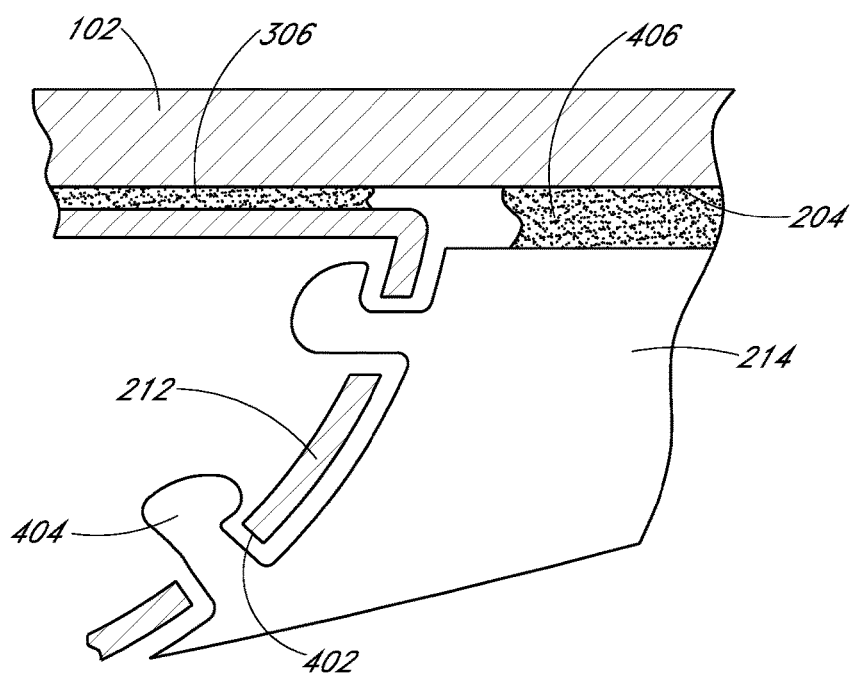
FIG. 4 illustrates a cross-sectional view of a mechanical connection between components of a distributed support frame, in accordance with an embodiment of the present disclosure.

Referring to FIG. 4, a cross-sectional view of a mechanical connection between components of a distributed support frame is illustrated in accordance with an embodiment of the present disclosure. Support mounts 210 of distributed support frame 206 may be interconnected by laterally extending support members, such as support rib 214 or support rails (not shown). More particularly, the support members may include an elongated structure having a first and second end, and each end may be connected to a respective support mount 210. For example, support hub 212 may include one or more hub connectors 402, and support rib 214 may include one or more rib connectors 404. Hub connector 402 may engage with rib connector 404 to connect support rib 214 to support hub 212. For example, hub connector 402 may include a slot formed through a wall of support hub 212. Rib connector 404, on the other hand, may include a projection such as a hook feature that is insertable through the slot of hub connector 402 to hook support rib 214 into place relative to support hub 212. It will be appreciated, however, that such mechanical interlocking features are provided by way of example only. In other embodiments, hub connector 402 and rib connector 404 may include corresponding snap features, peg and hole features, or any other male and female fastener features to allow support rib 214 to be mechanically interlocked with support hub 212.

In an embodiment, support rib 214 or support rails (not shown) may be adhered to one or more components of PV module 102 or distributed support frame 206. For example, a sealant material such as an RTV adhesive may be applied at the mechanical joints between hub connector 402 and rib connector 404. The sealant material may support the mechanical interlock between the connectors. Similarly, an adhesive joint 406 may be formed between an upper surface of support rib 214 and back surface 204 of PV module 102. Adhesive joint 406 may be formed concurrently or after the application or curing of adhesive layer 306 between PV module 102 and support hub 212. Accordingly, adhesive joint 406 may be a portion of adhesive layer 306.

Figure 5:
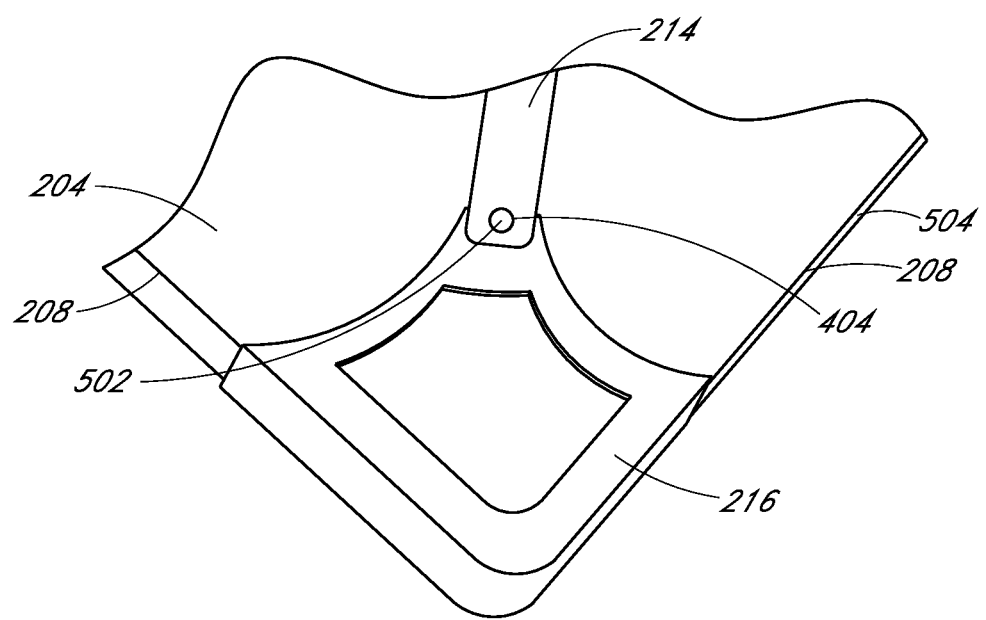
FIG. 5 illustrates a perspective back view of a corner of a photovoltaic panel, in accordance with an embodiment of the present disclosure.

Referring to FIG. 5, a perspective back view of a corner of a PV panel is illustrated in accordance with an embodiment of the present disclosure. Each support mount 210 of distributed support frame 206 may have a respective interfacial surface 304 facing PV module 102. In the case of corner supports 216, the interfacial surface 304 may face back surface 204 inward from lateral perimeter 208, or alternatively, may face inward toward an outer edge of PV module 102 at lateral perimeter 208. Thus, corner supports 216 may be adhered to back layer 202 of PV module 102 by respective adhesive layers 306 between the respective interfacial surfaces 304 of the corner supports 216 and the back layer 202 of PV module 102.

Corner support 216 may mechanically interlock with support rib 214. For example, corner support 216 may include a corner connector 502 to engage with rib connector 404 of support rib 214. In an embodiment, rib connector 404 includes a hole extending vertically through support rib 214, and corner connector 502 includes a protrusion, such as a bulbous prong, that snaps into the hole to mechanically interlock corner support 216 to support rib 214. It will be appreciated that other interlock features may be used, however, to connect rib connector 404 to corner connector 502. Furthermore, the mechanical interlock between corner connector 502 and rib connector 404 may be at any location between support rib 214 and corner support 216. For example, the connection may be made inward from lateral perimeter 208, as shown, or at lateral perimeter 208. The mechanical interlock between corner connector 502 and rib connector 404 may be strengthened by an adhesive joint, e.g., a bead of RTV sealant, applied to the interconnection between corner connector 502 and rib connector 404.

A support member, e.g., support rib 214, may extend laterally over back surface 204 between several support mounts 210 other than support hub 212 and corner support 216. For example, an edge support 504 may extend along lateral perimeter 208 between a first corner support 216 at a first corner 108 of PV module 102 to a second corner support 216 at second corner 108 of PV module 102. Edge support 504 may provide lateral stability to PV panel 100, and may be helpful to handling of PV panel 100. Edge support 504, however, may be an optional component of distributed support frame 206. When edge support 504 is included in distributed support frame 206, edge support 504 may be connected to corner support 216 by a mechanical interlock and/or an adhesive joint, as described above.

Corner supports 216 may include rounded corners 108 matching a corner of PV panel 100. For example, corners 108 may have a radius within a plane of the panel as shown in FIGS. 2 and 5. Corners 108 may also be rectilinear, however. For example, corners 108 may include a vertex of orthogonal edges of PV panel 100, which meet at corners 108 to form a sharp corner. A rounded corner 108 may be easier to assemble and may enhance the aesthetics of PV panel 100.

Figure 6:
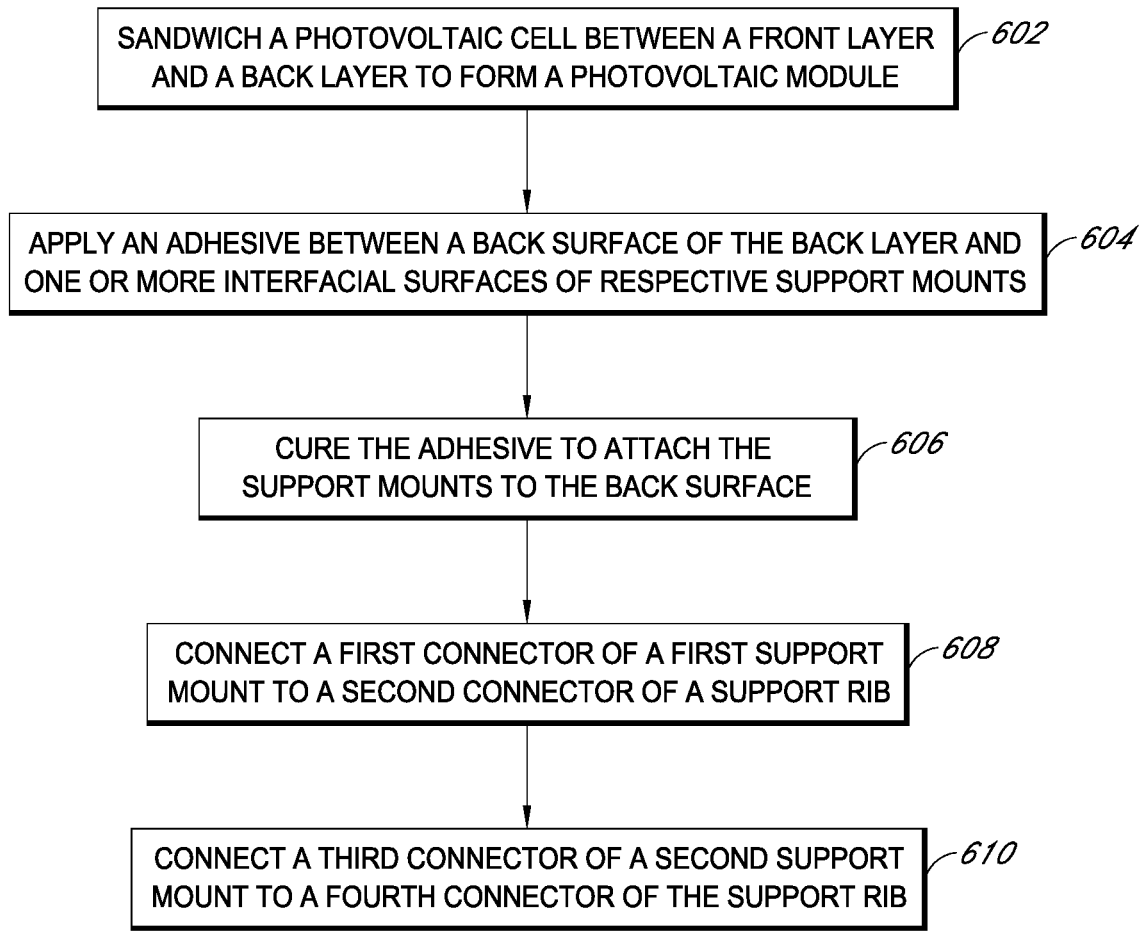
FIG. 6 illustrates a method of adhering a photovoltaic module to a distributed support frame during a lamination process, in accordance with an embodiment of the present disclosure.

Referring to FIG. 6, a method of adhering a PV module to a distributed support frame during a lamination process is illustrated in accordance with an embodiment of the present disclosure. The method may eliminate the need to apply an adhesive between a support frame and a PV module separately from the lamination process used to form the PV module. Thus, the method may be performed faster and at a lower cost than existing frame bonding techniques.

At operation 602, encapsulant 302 may be added between front layer 106 and back layer 202. More particularly, encapsulant 302 may be disposed between front layer 106 and a front side of PV cell 104, and between back layer 202 and a back side of PV cell 104. For example, encapsulant 302 may be applied to a back side of front layer 106 and to a front side of back layer 202. Accordingly, PV cell 104 may be sandwiched between encapsulant 302, and between front layer 106 and back layer 202, to form an uncured PV module laminate structure.

At operation 604, an adhesive may be applied to back surface 204. As described above, back layer 202 may include back surface 204 having lateral perimeter 208. The adhesive may be administered to back surface 204 inward from lateral perimeter 208. In an embodiment, the adhesive includes a same material as encapsulant 302. Accordingly, the addition of the adhesive over the back surface 204 of PV module 102 may include applying a third layer of encapsulant 302 over back surface 204. One or more support mounts 210 of distributed support frame 206 may be placed on the adhesive. For example, support hub 212 may be mounted at a central location of back surface 204, and one or more corner supports 216 may be mounted and attached to back surface 204 at respective corners 108 of PV module 102. Thus, the adhesive may be applied between back surface 204 and respective interfacial surfaces 304 of support members or mounts 210, e.g., support hub 212 and corner support 216.

In a pre-cured state, encapsulant 302 and adhesive layer 306 may be slightly melted, i.e., at least partially liquid. Accordingly, a vacuum may be applied to the uncured assembly to evacuate air from the binder layers. The vacuum may draw air out of encapsulant 302 and adhesive layer 306 material to reduce a likelihood that bubbles will form within the cured encapsulant and adhesive layers.

Mechanical pressure may be exerted on the uncured assembly before and during a curing operation. For example, a clamp may squeeze encapsulant 302 and adhesive layer 306 between respective components of the assembly. In an embodiment, pressure is applied to a back side of support hub 212 to squeeze adhesive layer 306 between back surface 204 and interfacial surface 304. A mat or pad may be used to cover the back side of support hub 212 and/or support ribs 214 to distribute the pressure more evenly across PV module 102. For example, a silicone mat may be disposed between PV panel 100 and a jaw of the clamp to absorb and distribute pressure from the jaw to PV panel 100. Furthermore, to reduce the likelihood of localized stresses or punctures to PV module 102, a front surface and a back surface of support hub 212 and support ribs 214 may be smooth, i.e., without sharp edges. For example, as shown in FIG. 3, the front surface of support hub 212 may be flat and the back surface 204 of support hub 212 may have a smooth curvature, i.e., may be rounded.

At operation 606, encapsulant 302 and/or adhesive layer 306 may be cured to create an adhesion interface between respective PV panel components. For example, adhesive layer 306 may be cured to attach support hub 212 to back surface 204 at a location inward from lateral perimeter 208 or to attach corner supports 216 to back layer 202 at the corners 108 of PV module 102. As described above, adhesive layer 306 may include a heat cured adhesive, and thus, adhesive layer 306 may be cured by heating PV panel 100 to an elevated temperature. As described above, adhesive layer 306 may include a light cured material, and thus, adhesive layer 306 may be cured by irradiating a portion of PV panel 100 with ultraviolet light. Encapsulant 302 and the adhesive of adhesive layer 306 may include a same material, and thus, the heat or light curing mechanism may cause the encapsulant material to cross-link simultaneously with the adhesive material. More particularly, encapsulant 302 may cure concurrently with adhesive layer 306 in a same lamination operation.

After the lamination operation in which the laminate structure of PV module 102 is cured at the same time that support mounts 210 are adhered to back layer 202, distributed support frame 206 may be assembled. At operation 608, a first support mount 210, such as support hub 212, may be connected, e.g., mechanically interlocked, with a corresponding support rib 214. More particularly, a first rib connector 404 of support rib 214 may engage hub connector 402 of the first support mount 210, e.g., support hub 212. Support rib 214 may therefore extend laterally over back surface 204 away from support hub 212. Accordingly, support rib 214 may form a cantilever extending radially from support hub 212.

At operation 610, a second support mount 210, such as corner support 216, may be connected, e.g., mechanically interlocked, with the corresponding support rib 214. More particularly, a second rib connector 404 of support rib 214 may engage corner connector 502 of the second support mount 210, e.g., corner support 216. Accordingly, support rib 214 may form an end supported beam extending between support hub 212 and corner support 216.

Whether support rib 214 actually supports PV module 102 as a cantilever or an end supported beam may be determined by the external support connected to distributed support frame 206. For example, when support hub 212 is mounted on a roof structure and corner support 216 is not connected to an external structure, support rib 214 may actually support PV module 102 as a cantilever. By contrast, when both support hub 212 and corner support 216 are mounted on the roof structure, support rib 214 may actually support PV module 102 as an end supported beam. In either case, distributed support frame 206 may counteract a downward deflection of PV module 102 when a wind or snow load is applied to front layer 106.

PV panels having a PV module adhered to support frame components, and methods of manufacturing such PV panels, have been described.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A photovoltaic panel, comprising:
   a photovoltaic module having a photovoltaic cell between a front layer and a back layer, wherein the back layer includes a back surface, the photovoltaic module having a lateral perimeter with a height;
   a distributed support frame including one or more support members having an interfacial surface facing the back surface of the photovoltaic module inward from the lateral perimeter, wherein the distributed support frame extends and is positioned along the back surface of the photovoltaic module and the distributed support frame has a cantilevered distal portion that is positioned along the height of the lateral perimeter of the photovoltaic module and the distributed support frame is positioned along at most only a portion of a back surface of the lateral perimeter of the photovoltaic module; and an adhesive layer between the back surface of the photovoltaic module and along the interfacial surface of the support members, wherein the support members include a support hub affixed at the interfacial surface to the back surface of the photovoltaic module by the adhesive layer.

2. The photovoltaic panel of claim 1, wherein the support members of the distributed support frame comprise support ribs coupled to and detachable from the support hub and at least one of the support ribs comprising a cantilevered distal end.

3. The photovoltaic panel of claim 2, wherein the photovoltaic module includes a corner, and wherein the support members further comprise a corner support.

4. The photovoltaic panel of claim 1, wherein the adhesive layer includes one or more of a heat cured adhesive or a light cured material.

5. The photovoltaic panel of claim 4, wherein the photovoltaic module includes an encapsulant between the front layer and the photovoltaic cell, and wherein the encapsulant and the adhesive include the heat cured adhesive.

6. The photovoltaic panel of claim 4, wherein the adhesive includes the light cured material, and wherein the one or more support members are translucent to ultraviolet light.

7. The photovoltaic panel of claim 1, wherein the front layer and the back layer have different elastic moduli.

8. The photovoltaic panel of claim 7, wherein the front layer includes a glass sheet, and wherein the back layer includes a polymer sheet.

9. A photovoltaic panel, comprising:
a photovoltaic module having a photovoltaic cell between a front layer and a back layer, wherein the back layer includes a back surface, the photovoltaic module having a lateral perimeter;
a distributed hub and spoke support frame including a plurality of support mounts having respective interfacial surfaces, wherein at least one interfacial surface of the plurality of support mounts faces the back surface of the photovoltaic module inward from the lateral perimeter; and
an adhesive layer between the back surface of the photovoltaic module and along a length of at least one interfacial surface inward from the lateral perimeter of the support mounts, wherein the support mounts include a support hub affixed at an interfacial surface within the lateral perimeter of the photovoltaic module by the adhesive layer, wherein at least two support mounts extend from the support hub and have cantilevered distal ends that extend to and are secured to the lateral perimeter of the photovoltaic module, and wherein at least the two support mounts lie along reference lines that intersect each other.

10. The photovoltaic panel of claim 9, wherein the at least two support mounts are support ribs, the support ribs detachably coupled to the support hub.

11. The photovoltaic panel of claim 10, wherein the support hub includes a first connector, wherein one of the support ribs includes a second connector, and wherein the first connector is coupled to the second connector.

12. The photovoltaic panel of claim 9, wherein the photovoltaic module includes an encapsulant between the front layer and the photovoltaic cell, and wherein the encapsulant and the adhesive layer along a length of at least one interfacial surface of the support mounts and between the support hub and an interfacial surface of the photovoltaic module comprise the same adhesive and wherein the adhesive layer includes one or more of a heat cured adhesive or a light cured material.

13. The photovoltaic panel of claim 12, wherein the adhesive includes the light cured material, and wherein the support mounts are translucent to ultraviolet light.

14. The photovoltaic panel of claim 9, wherein the front layer and the back layer have different elastic moduli.

15. The photovoltaic panel of claim 14, wherein the front layer includes a glass sheet, and wherein the back layer includes a polymer sheet.

16. A photovoltaic panel, comprising:
a photovoltaic module having a photovoltaic cell between a front layer and a back layer, wherein the back layer includes a back surface, the photovoltaic module having a perimeter;
a distributed support frame including one or more support members having an interfacial surface facing the back surface of the photovoltaic module inward from the perimeter, and wherein the distributed support frame surrounds one or more corners of but less than an entirety of the perimeter of the photovoltaic module; and
an adhesive layer between the back surface of the photovoltaic module and the interfacial surface of the support members, wherein the support members include a support hub and corner supports, the corner supports configured to extend along an outside upright surface of the perimeter of the photovoltaic laminate, the corner supports spaced apart from each other and unattached to each other via an outer border of the distributed support frame.

17. The photovoltaic panel of claim 16, wherein the distributed support frame includes one or more support ribs.

18. The photovoltaic panel of claim 17 wherein at least one of the support ribs is detachably coupled to the support hub.

* * * * *